(12) United States Patent
Kim et al.

(10) Patent No.: US 7,812,527 B2
(45) Date of Patent: Oct. 12, 2010

(54) ORGANIC ELECTRO-LUMINESCENT DISPLAY DEVICE

(75) Inventors: Hoon Kim, Hwaseong-si (KR); Jin Koo Chung, Suwon-si (KR); Won Hoe Koo, Suwon-si (KR); Jung Mi Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 345 days.

(21) Appl. No.: 11/933,342

(22) Filed: Oct. 31, 2007

(65) Prior Publication Data
US 2009/0001895 A1    Jan. 1, 2009

(30) Foreign Application Priority Data
Dec. 15, 2006    (KR) ...................... 10-2006-0128274

(51) Int. Cl.
*H01J 1/62* (2006.01)
(52) U.S. Cl. ............................. 313/506; 257/72; 257/88
(58) Field of Classification Search ................... 257/40, 257/72, 88, 99, 103; 313/483, 506, 509; 315/169.3; 345/45, 76
See application file for complete search history.

(56) References Cited

U.S. PATENT DOCUMENTS

| | | | | |
|---|---|---|---|---|
| 6,788,278 B2* | 9/2004 | Aoki | ............................. | 345/82 |
| 7,068,247 B2* | 6/2006 | Nakanishi | ..................... | 345/76 |
| 7,221,096 B2* | 5/2007 | Oh et al. | ...................... | 313/512 |
| 7,521,859 B2* | 4/2009 | Park | ............................. | 313/505 |
| 2005/0218800 A1* | 10/2005 | Lee | ............................. | 313/506 |

FOREIGN PATENT DOCUMENTS

| | | |
|---|---|---|
| JP | 2006-086085 | 3/2006 |
| KR | 10-2002-0089896 | 11/2002 |
| KR | 10-2003-0030380 | 4/2003 |

\* cited by examiner

*Primary Examiner*—Thuy Vinh Tran
(74) *Attorney, Agent, or Firm*—H.C. Park & Associates, PLC

(57) ABSTRACT

An organic electro-luminescent display device includes barriers in a non-display area to protect a display area from water and oxygen. Barriers may include a permeation prevention barrier, a voltage contact portion, and a blocking layer. A permeation prevention barrier includes contact portions where a barrier layer having a lower permeability than a passivation layer penetrates through the passivation layer. A voltage contact portion penetrates the passivation layer so that a signal supply line contacts a conductive material. A blocking layer covers a wall, a planarization layer, and an inorganic insulation layer, and has a lower permeability than the planarization layer, the wall, and the inorganic insulation layer. The permeation prevention barrier, the voltage contact portion, and the blocking layer may be used in various combinations.

25 Claims, 11 Drawing Sheets

ORGANIC ELECTRO-LUMINESCENT DISPLAY DEVICE

CROSS-REFERENCE TO RELATED APPLICATION

This application claims priority from and the benefit of Korean Patent Application No. 10-2006-0128274, filed on Dec. 15, 2006, which is hereby incorporated for all purposes as if fully set forth herein.

BACKGROUND OF THE INVENTION

1. Field of the Invention

The present invention relates to an organic electro-luminescent ("EL") display device and, in particular, to an organic EL display device that protects a display area from water and oxygen.

2. Discussion of the Background

An organic EL display device is a flat display device that displays an image by controlling luminescence of an organic light-emitting layer. The organic EL display device is used as an image display device in devices such as cellular phones, notebook computers, monitors, and televisions. The organic EL device is a self emissive display and has not only good contrast but also a fast response time. Thus, the organic EL display device is attracting attention as a next generation display device.

An active matrix organic EL display device arranges a plurality of pixels including red (R), green (G) and blue (B) sub-pixels in a matrix arrangement to display an image. Each sub-pixel includes an organic EL cell and a cell driver to independently drive the organic EL cell. The organic EL cell includes a pixel electrode connected to the cell driver, a common electrode connected to a ground, and a light emitting layer arranged between the pixel electrode and the common electrode. The cell driver includes at least two thin film transistors ("TFTs") and a storage capacitor, formed between a gate line supplying a scan signal, a data line supplying a video data signal, and a common power line supplying common power signals, to drive the pixel electrode of the organic EL cell.

When the organic EL display device is driven for a long time in high temperature and high humidity, an organic layer in a non-display area may be exposed to water and oxygen and may be damaged.

SUMMARY OF THE INVENTION

The present invention provides an organic EL display device that protects a display area from water and oxygen.

Additional features of the invention will be set forth in the description which follows, and in part will be apparent from the description, or may be learned by practice of the invention.

The present invention discloses an organic electro-luminescent display device including a display area including an organic luminescent element to display an image and a non-display area arranged on an outer circumference of the display area. The organic luminescent element includes an anode, an organic light-emitting layer arranged on the anode, and a cathode arranged on the organic light-emitting layer. The non-display area includes a signal supply line to supply a signal to the organic luminescent element, a passivation layer arranged on the signal supply line, and a permeation prevention barrier penetrating the passivation layer. The permeation prevention barrier includes a barrier layer having a lower permeability than the passivation layer.

The present invention also discloses an organic electro-luminescent display device including a display area, and a non-display area arranged on an outer circumference of the display area. The display area includes a gate line and a data line, a switching thin film transistor connected to the gate line and the data line, a driving thin film transistor connected to the switching thin film transistor, an anode connected to the driving thin film transistor, an organic light-emitting layer arranged on the anode, and a cathode arranged on the organic light-emitting layer. The non-display area includes a signal supply line to supply a signal to the display area, an inorganic insulation layer arranged on the signal supply line, a wall arranged on the inorganic insulation layer, and a blocking layer covering a side part of the wall. The blocking layer includes a blocking material having a lower permeability than the wall.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
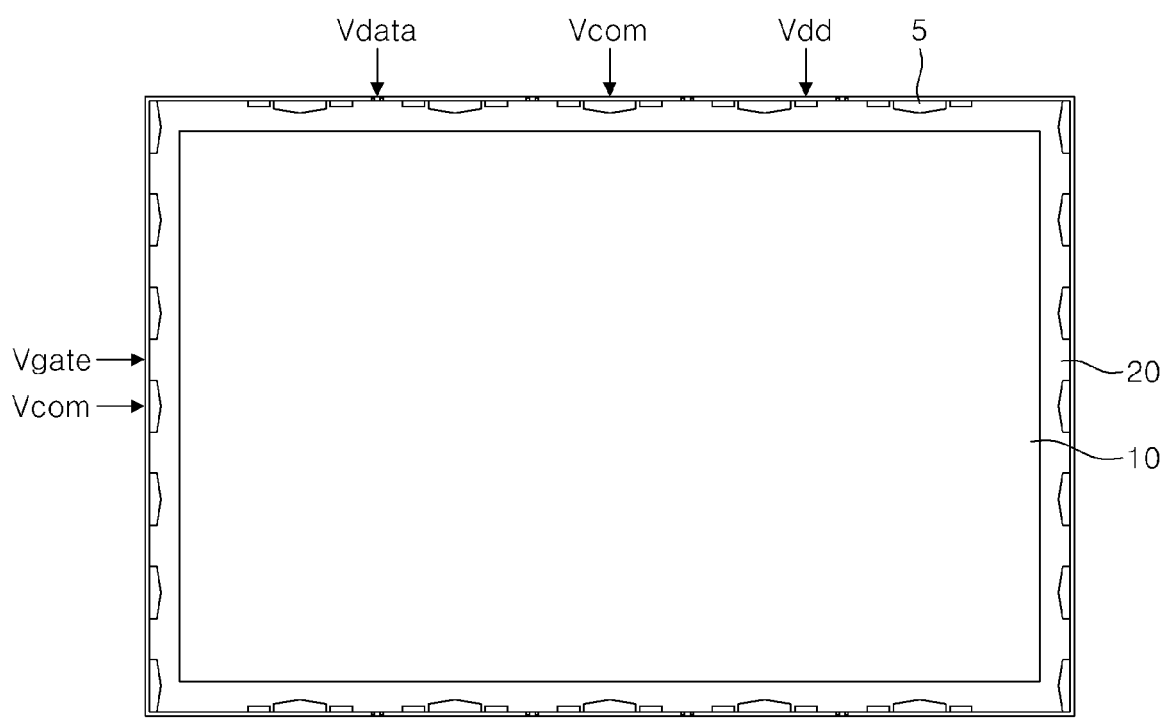
FIG. 1 is a plan view showing an organic EL display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative size of layers and regions may be exaggerated for clarity. Like reference numerals in the drawings denote like elements.

It will be understood that when an element such as a layer, film, region or substrate is referred to as being "on", "connected to", or "coupled to" another element or layer, it can be directly on, directly connected to, or directly coupled to the other element or layer, or intervening elements or layers may also be present. In contrast, when an element is referred to as being "directly on", "directly connected to", or "directly coupled to" another element or layer, there are no intervening elements or layers present.

Figure 2:
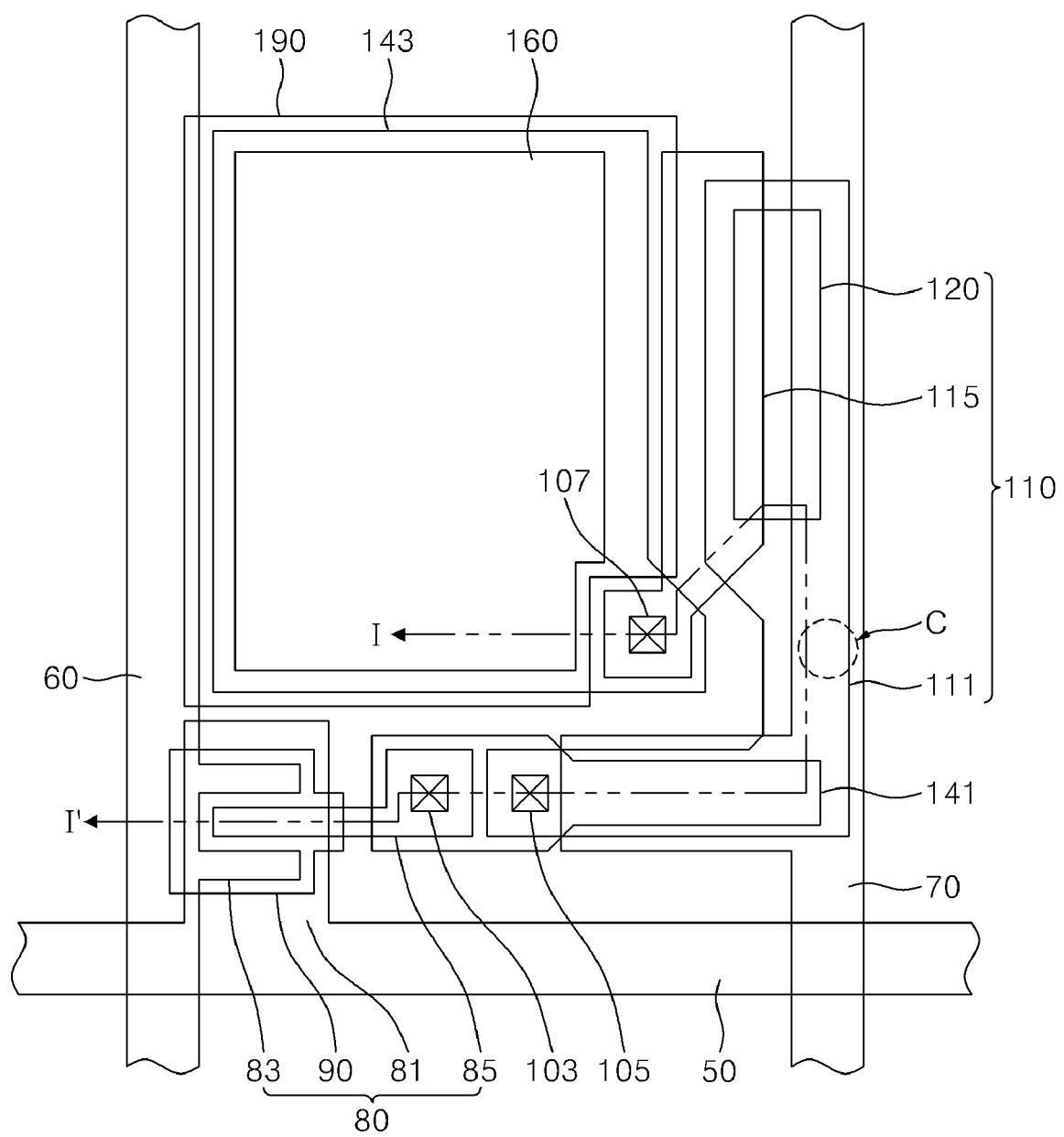
FIG. 2 is a plan view showing a display area of an organic EL display device according to an exemplary embodiment of the present invention.

FIG. 1 is a plan view showing an organic EL display device according to an exemplary embodiment of the present invention. FIG. 2 is a plan view showing a display area of the organic EL display device according to an exemplary embodiment of the present invention, and FIG. 3 is a cross-sectional view showing a display area of the organic EL display device taken along line I-I' of FIG. 2.

Figure 3:
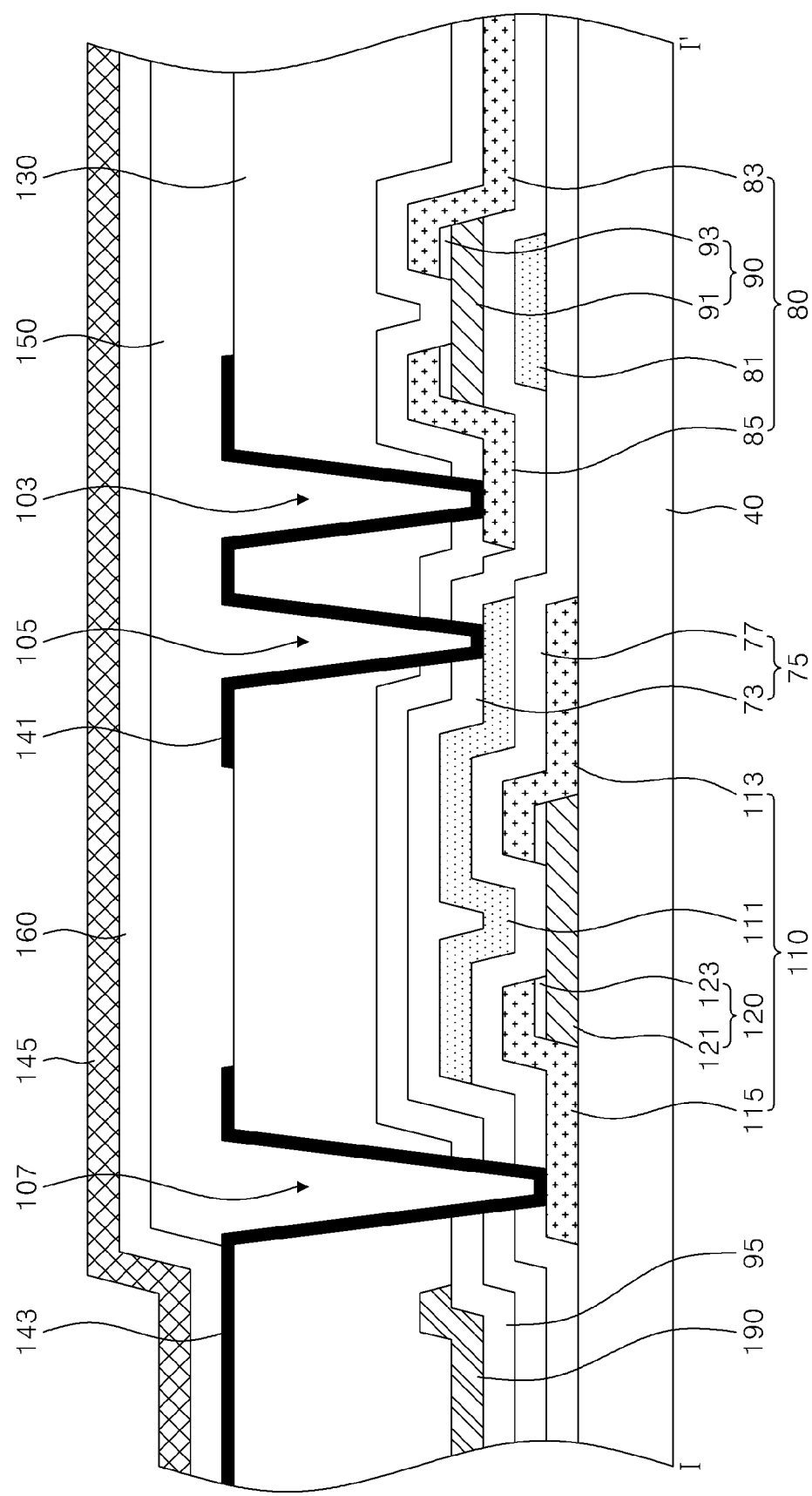
FIG. 3 is a cross-section view showing the display area of the organic EL display device taken along line I-I' of FIG. 2.

Referring to FIG. 1, FIG. 2, and FIG. 3, an organic EL display device 300 includes a display area 10 and a non-display area 20. The display area 10 includes an organic EL cell to emit light for displaying an image and the non-display area 20 is arranged on an outer circumference of the display area 10 to supply a signal to the organic EL cell.

The display area 10 of the organic EL display device 300 includes a gate line 50, a data line 60, a power line 70, a switching TFT 80, a driving TFT 110, an anode 143, an organic light-emitting layer 160, and a cathode 145. As described above, the organic EL cell includes the anode 143, the organic light-emitting layer 160, and the cathode 145.

The gate line 50 supplies a gate signal to the switching TFT 80 and the data line 60 supplies a data signal to the switching TFT 80. The power line 70 supplies a power signal to the driving TFT 110.

The switching TFT 80 is turned on when the gate signal is supplied to the gate line 50 so that the switching TFT 80 supplies the data signal from data line 60 to a storage capacitor C and a second gate electrode 111 of the driving TFT 110. For doing this, the switching TFT 80 includes a first gate electrode 81 connected to the gate line 50, a first source electrode 83 connected to the data line 60, a first drain electrode 85 facing the first source electrode 83 and connected to the second gate electrode 111 of the driving TFT 110 and the storage capacitor C, and a first semiconductor pattern 90 including a channel portion between the first source electrode 83 and the first drain electrode 85. Herein, the first semiconductor pattern 90 includes a first active layer 91 overlapping the first gate electrode 81 with the first gate insulation layer 73 disposed between the first active layer 91 and the first gate electrode 81, and a first ohmic contact layer 93 arranged on the first active layer 91 except the channel portion to provide an ohmic contact between the first active layer 91 and the first source electrode 83 and between the first active layer 91 and the first drain electrode 85. The first active layer 91 may be amorphous silicon or poly silicon. Amorphous silicon may offer the advantage of turning on and off rapidly.

The driving TFT 110 adjusts the luminescence of an organic EL cell by controlling a current supplied from the power line 70 to the organic EL cell in response to the data signal supplied to the second gate electrode 111. The driving TFT 110 includes the second gate electrode 111 connected to the first drain electrode 85 of the switching TFT 80 through a connection electrode 141, a second source electrode 113 connected to the power line 70, a second drain electrode 115 facing the second source electrode 113 and connected to the anode 143, and a second semiconductor pattern 120 including a channel portion between the second source electrode 113 and the second drain electrode 115. Herein, the connection electrode 141 is arranged on a planarization layer 130 and may be made of the same material as the anode 143. The connection electrode 141 connects the first drain electrode 85, exposed by a first contact hole 103, to the second gate electrode 111, exposed by a second contact hole 105. The first contact hole 103 penetrates a passivation layer 95 arranged on the switching TFT 80 and the planarization layer 130 to expose the first drain electrode 85. The second contact hole 105 penetrates the first gate insulation layer 73, the passivation layer 95 and the planarization layer 130 to expose the second gate electrode 111.

The second semiconductor pattern 120 includes a second active layer 121 overlapping the second gate electrode 111 with a second gate insulation layer 77 disposed between the second active layer 121 and the second gate electrode 111, and a second ohmic contact layer 123 arranged on the second active layer 121 except a channel portion to provide an ohmic contact between the second active layer 121 and the second source electrode 113 and between the second active layer 121 and the second drain electrode 115. The second active layer 121 may be amorphous silicon or poly silicon. Poly silicon may offer the advantage of increased current mobility for the driving TFT 110 since current continuously flows through the driving TFT 110 while the organic EL cell emits light.

The second gate insulation layer 77 and the first gate insulation layer 73 may be components of an inorganic insulation layer 75.

The storage capacitor C includes a region where the power line 70 overlaps with the second gate electrode 111 of the driving TFT 110, with the second gate insulation layer 77 disposed therebetween. Even if the switching TFT 80 is turned off, a voltage charged in the storage capacitor C makes it possible to provide a constant current to the driving TFT 110 until a data signal of the next frame is supplied, thereby maintaining the luminescence of the organic EL cell.

The cathode 145 faces the anode 143 with the organic light-emitting layer 160 disposed therebetween. The organic light-emitting layer 160 is arranged on a sub-pixel basis. The anode 143 overlaps a color filter 190 and is independently arranged in each sub-pixel region on the planarization layer 130. The anode 143 is connected to the second drain electrode 115 of the driving TFT 110 exposed by a third contact hole 107 penetrating the passivation layer 95, the planarization layer 130, the first gate insulating layer 73, and the second gate insulating layer 77. The anode 143 may be indium tin oxide ("ITO"), tin oxide ("TO"), indium zinc oxide ("IZO"), indium tin zinc oxide ("ITZO"). The cathode 145 may be aluminum ("Al"), magnesium ("Mg"), silver ("Ag"), calcium ("Ca"), or another metal having superior electron supply ability and reflection efficiency.

The organic light-emitting layer 160 may generate white ("W") light. The color filter 190 is arranged on the passivation layer 95 and overlaps the organic light-emitting layer 160. The color filter 190 filters the W light into light having R, G, and B colors. The light having R, G, and B colors is emitted to the outside of the organic EL display device through an insulation substrate 40.

The organic EL cell includes the anode 143 made of a transparent conductive material on the planarization layer 130, the organic light-emitting layer 160 including a light-emitting layer arranged on the anode 143 and at least partially arranged on a wall 150, and the cathode 145 arranged on the organic light-emitting layer 160. The organic light-emitting layer 160 may include a light emitting layer and one or more of a hole injection layer, a hole transport layer, an electron transport layer, and an electron injection layer, which are stacked on the anode 143 and at least partially on the wall 150. The light-emitting layer may include sequentially deposited R, G, and B layers or two color layers having a complementary relationship. Also, the light-emitting layer may be implemented with a single layer emitting W light. The light-emitting layer included in the organic light-emitting layer 160 emits light in the direction of the color filter 190 according to the current from the anode 143 to the cathode 145.

Hereinafter, exemplary embodiments of the present invention will be described with reference to FIG. 4, FIG. 5, FIG. 6, FIG. 7, and FIG. 8. For the purpose of describing these exemplary embodiments, reference numeral 223 shall refer to a transparent layer 223 made of the same material as the anode 143, and reference numeral 225 shall refer to a metal layer 225 made of the same material as the cathode 145. The conductive material may be implemented as a double layer structure including both the transparent layer 223 and the metal layer 225.

Figure 4:
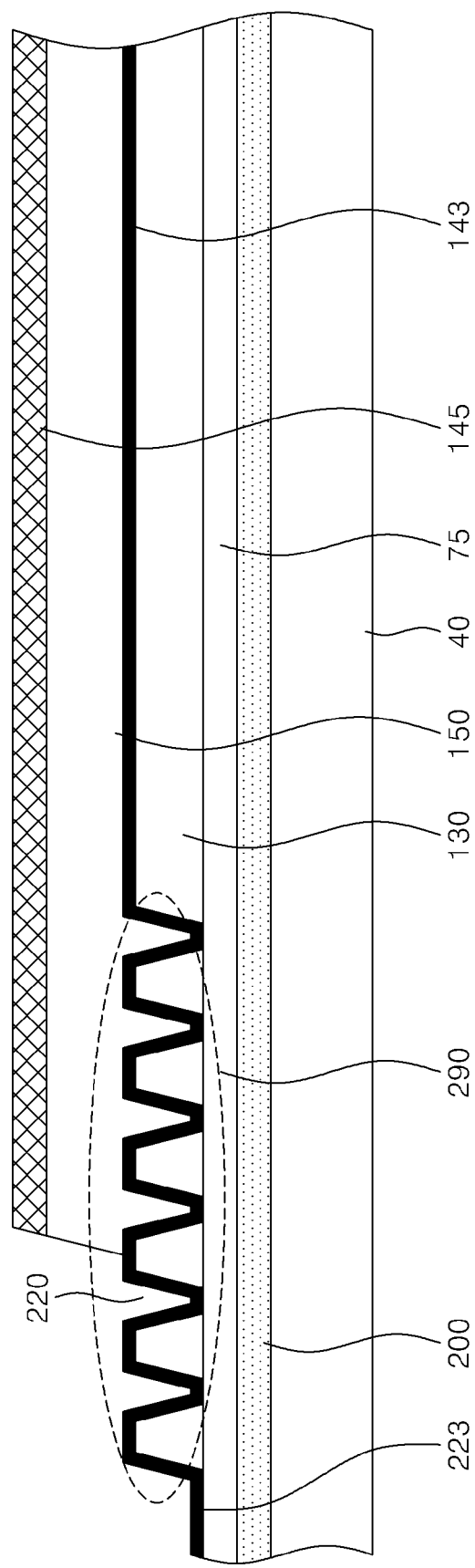
FIG. 4 is a cross-section view showing a non-display area of the organic EL display device according to a first exemplary embodiment of the present invention.

FIG. 4 is a cross-sectional view showing a non-display area of the organic EL display device according to a first exemplary embodiment of the present invention.

The non-display area 20 includes a permeation prevention barrier 290, a signal supply line 200, and a passivation layer, which may include the inorganic insulation layer 75, the planarization layer 130, and the wall 150.

The signal supply line 200 may be a line for supplying a gate voltage Vgate to the gate line 50, a line for supplying a data voltage Vdata to the data line 60, or a line for supplying a common voltage Vcom or a power voltage Vdd to the power line 70 shown in FIG. 1. The line for supplying the gate voltage Vgate may be made of the same material as the gate line 50. The lines for supplying the data voltage Vdata, the common voltage Vcom and the power voltage Vdd may be made of the same material as the data line 60. The line for supplying the common voltage Vcom is supplied with a driving voltage from a driving circuit (not shown) through a voltage contact hole 5 shown in FIG. 1.

The passivation layer is arranged on the signal supply line 200. The passivation layer includes the inorganic insulation layer 75 and an organic layer. The inorganic insulation layer 75 insulates the signal supply line 200 from other layers. The organic layer arranged on the inorganic insulation layer 75. The organic layer may be implemented as a single layer structure including the planarization layer 130 or the wall 150, or as a double layer structure including the planarization layer 130 and the wall 150.

The anode 143 is arranged on the planarization layer 130, and the cathode 145 is arranged on the wall 150. Alternatively, either of the anode 143 or the cathode 145 may be arranged on the organic layer depending on the types of signal supply line 200 as described above.

The permeation prevention barrier 290 penetrates the passivation layer. More specifically, the permeation prevention barrier 290 may penetrate the inorganic insulation layer 75 only, it may penetrate both the inorganic insulation layer 75 and the organic layer, or it may penetrate the organic layer only. The permeation prevention barrier 290 may be implemented as a barrier layer having a single layer structure or a double layer structure. The permeation prevention barrier 290 may be implemented as a barrier layer having a single layer structure made of an inorganic material or a conductive material. Herein, the inorganic material may include silicon nitride ("SiNx") or silicon oxide ("SiOx"), and the conductive material may include the same material as the anode 143, such as ITO, TO, IZO or ITZO, and/or the same material as the cathode 145, such as Al, Mg, Ag or Ca. More specifically, the permeation prevention barrier 290 may be implemented as a barrier layer having a double layer structure including the transparent layer 223 made of the same material as the anode 143 and the metal layer 225 made of the same material as the cathode 145. The transparent layer 223 and the metal layer 225 may prevent water and oxygen from permeating into the display area 10, since the transparent layer 223 and the metal layer 225 have lower permeability than the passivation layer. The permeation prevention barrier 290 includes contact portions 220 where the layer structure of the permeation prevention barrier 290 penetrates the inorganic insulation layer 75, the organic layer, or the inorganic insulation layer 75 and the organic layer to contact a lower layer.

Figure 5:
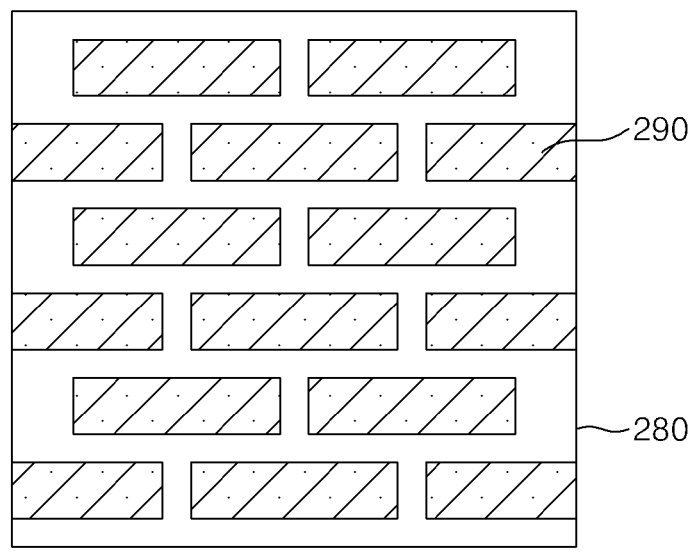
FIG. 5 is a plan view showing a permeation prevention pattern of the organic EL display device according to an exemplary embodiment of the present invention.
Figure 6:
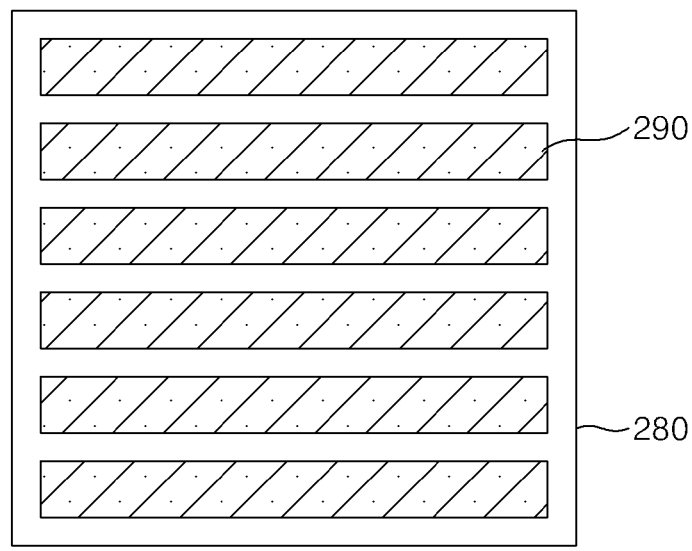
FIG. 6 is a plan view showing a permeation prevention pattern of the organic EL display device according to an exemplary embodiment of the present invention.

FIG. 5 is a plan view showing a permeation prevention pattern of the organic EL display device according to an exemplary embodiment of the present invention. FIG. 6 is a plan view showing a permeation prevention pattern of the organic EL display device according to an exemplary embodiment of the present invention.

Permeation prevention barriers 290 may cross with each other in a brick arrangement as shown in FIG. 5 or in a rectangular line arrangement as shown in FIG. 6. The permeation prevention barriers 290 arranged in the brick arrangement or the rectangular line arrangement constitute a permeation prevention pattern 280. The permeation prevention barrier 290 blocks a path through which water and oxygen in the atmosphere may otherwise permeate. The permeation prevention barriers 290 in the permeation prevention pattern 280 are arranged parallel to the insulation substrate 40 and a long side of the permeation prevention barrier 290 is perpendicular to the path through which water and oxygen may otherwise permeate.

Figure 7:
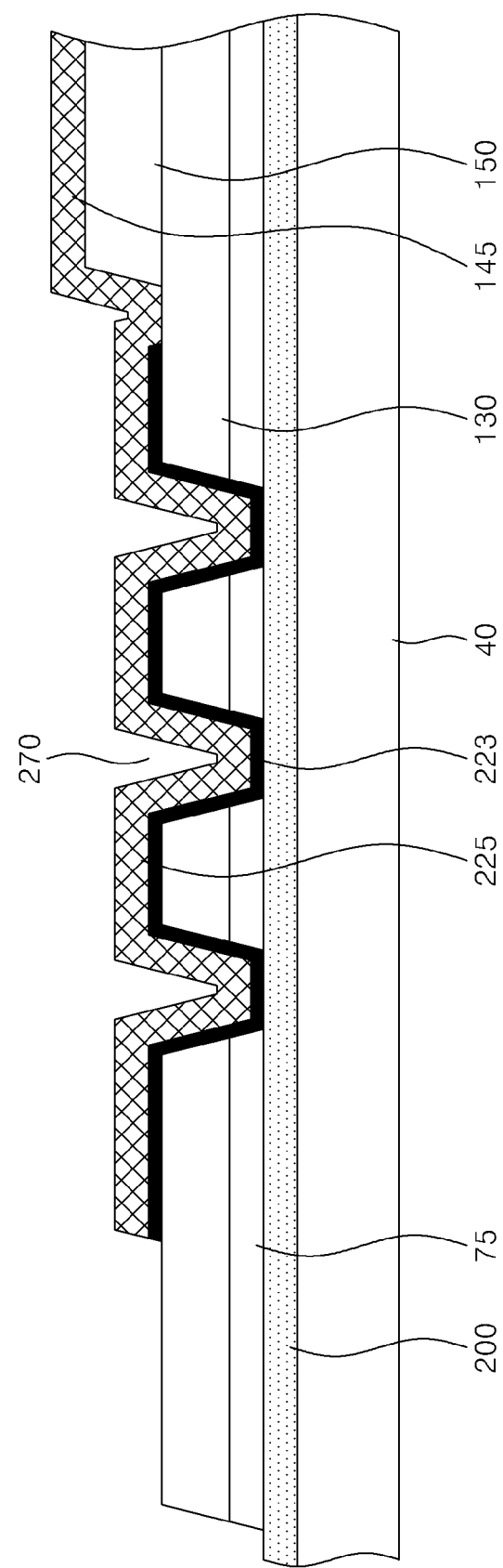
FIG. 7 is a cross-section view showing a non-display area of the organic EL display device according to a second exemplary embodiment of the present invention.

FIG. 7 is a cross-section view showing a non-display area of the organic EL display device according to a second exemplary embodiment of the present invention.

The non-display area 20 shown in FIG. 7 includes the same elements described with respect to FIG. 4, and also includes a voltage contact portion 270. Therefore, a description of the voltage contact portion 270 will be briefly provided hereinafter.

Referring to FIG. 7, the non-display area 20 includes the signal supply line 200, a voltage contact portion 270, and the passivation layer including the inorganic insulation layer 75, the planarization layer 130, and the wall 150.

The signal supply line 200 may be a line for supplying a gate voltage Vgate, a data voltage Vdata, or a common voltage Vcom. The signal supply line 200 may be made of the same material as the gate line 50 or the data line 60.

The voltage contact portion 270 penetrates the passivation layer so that the signal supply line 200 contacts a conductive material. The conductive material may be implemented as a single layer structure including either the transparent layer 223 or the metal layer 225, or as a double layer structure including both the transparent layer 223 and the metal layer 225. The voltage contact portion 270 may include a common voltage contact portion, a power voltage contact portion, a gate voltage contact portion, or a data voltage contact portion depending upon the type of signal supply line 200. More specifically, the gate voltage contact portion is formed by contact between the conductive material and the signal supply line 200 made of the same metal as the gate line 50 to supply a gate voltage signal to the gate line 50. The data voltage contact portion, the power voltage contact portion, and the common voltage contact portion are respectively formed by contact between the conductive material and the signal supply line 200 made of the same metal as the data line 60 to supply voltage signals to the data line 60, the switching TFT 80, the driving TFT 110, and the power line 70. The voltage contact portion 270 prevents water and oxygen in the atmosphere from permeating into the display area 10.

Figure 8:
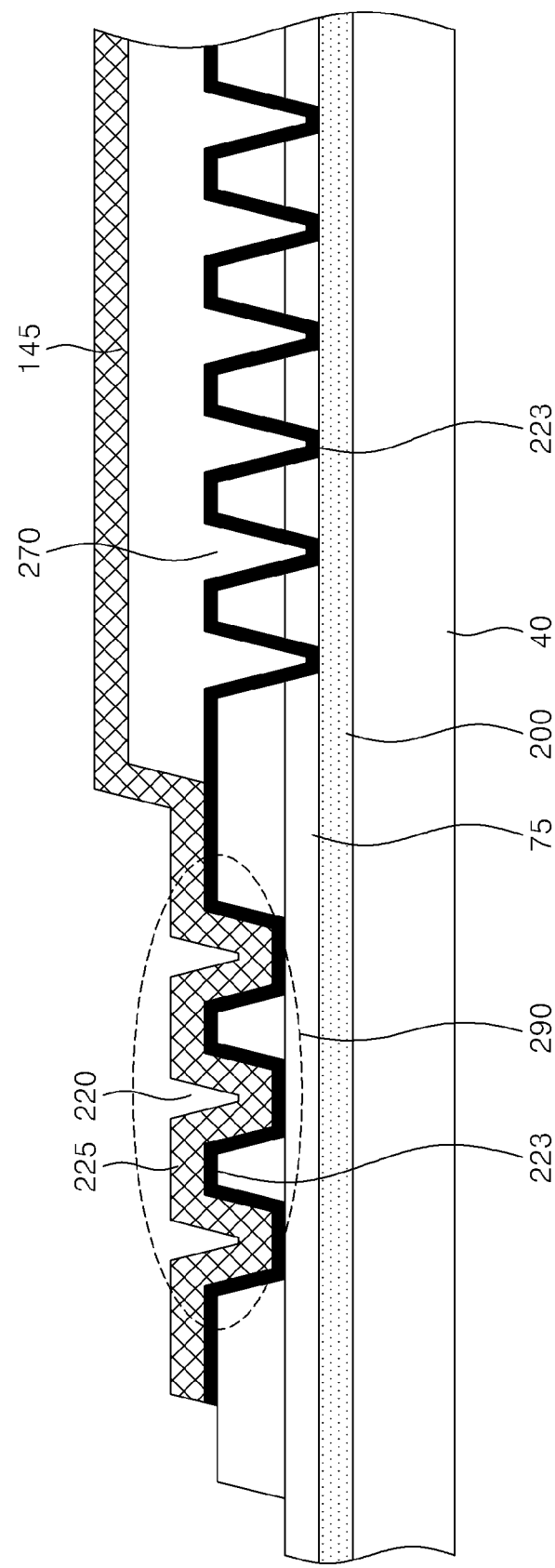
FIG. 8 is a cross-section view showing a non-display area of the organic EL display device according to a third exemplary embodiment of the present invention.

FIG. 8 is a cross-section view showing a non-display area of the organic EL display device according to a third exemplary embodiment of the present invention.

The non-display area 20 shown in FIG. 8 may include the permeation prevention barrier 290 as described above with respect to FIG. 4, and the voltage contact portion 270 described above with respect to FIG. 7. In this instance, both the permeation prevention barrier 290 and the voltage contact portion 270 prevent water and oxygen in the atmosphere from permeating into the display area 10.

Figure 9:
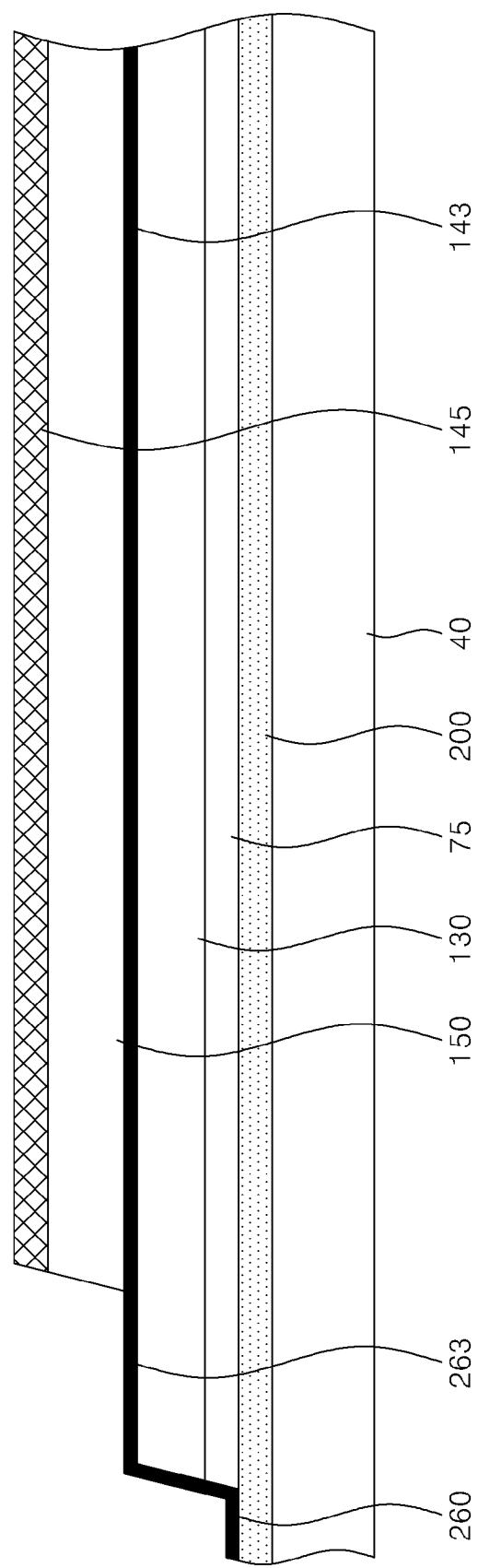
FIG. 9 is a cross-section view showing a non-display area of the organic EL display device according to a fourth exemplary embodiment of the present invention.
Figure 10:
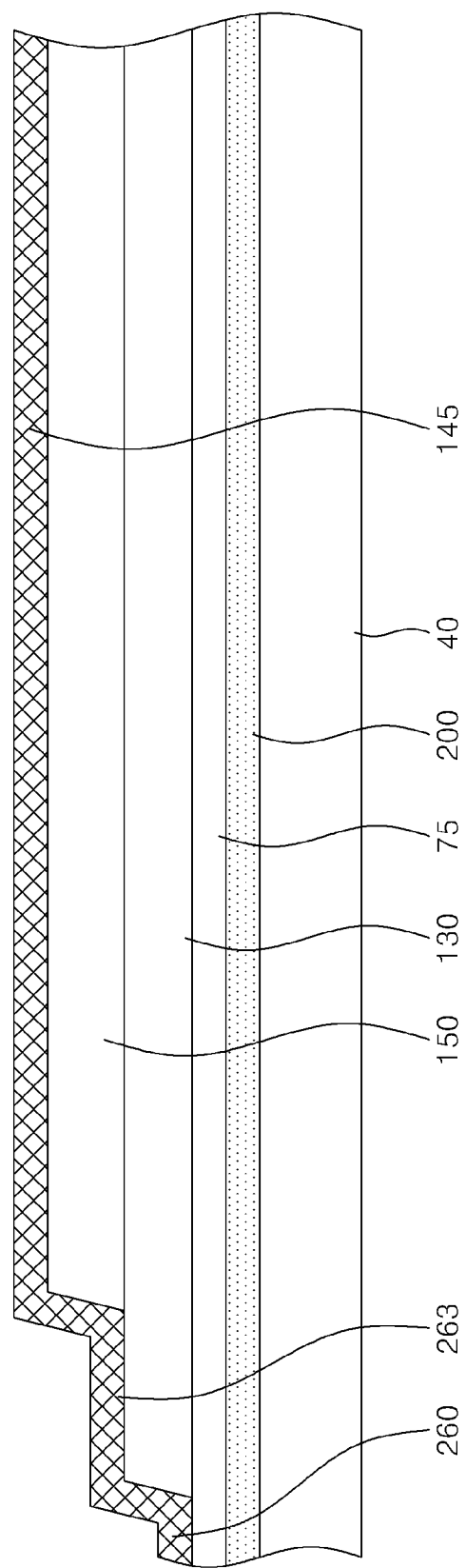
FIG. 10 is a cross-section view showing a non-display area of the organic EL display device according to a fifth exemplary embodiment of the present invention.
Figure 11:
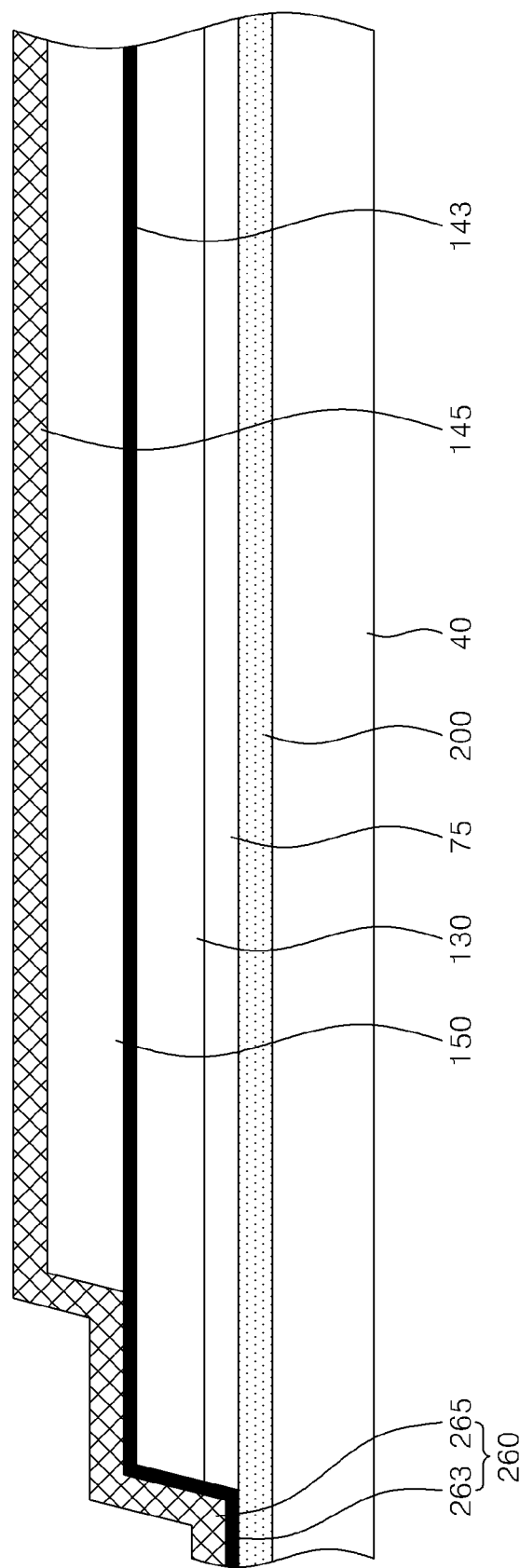
FIG. 11 is a cross-section view showing a non-display area of the organic EL display device according to a sixth exemplary embodiment of the present invention.

FIG. 9, FIG. 10, and FIG. 11 are cross-section views respectively showing a non-display area of the organic EL display device according to fourth, fifth and sixth exemplary embodiments of the present invention.

The non-display areas 20 shown in FIG. 9, FIG. 10 and FIG. 11 include the same elements as the non-display area 20 shown in FIG. 4, and also include a blocking layer 260. Therefore, a description thereof will be briefly described hereinafter.

The non-display area 20 includes the signal supply line 200, the inorganic insulation layer 75, the planarization layer 130, the wall 150, and the blocking layer 260.

The blocking layer 260 may be implemented as a single structure or a double structure. The blocking layer 260 may be implemented as a single layer structure including a transparent conductive layer 263 made of the same material as the anode 143 as described above. The transparent conductive layer 263 is arranged on the planarization layer 130. As shown in FIG. 10, the blocking layer 260 may be implemented as a single layer structure including a metal conductive layer 265 made of the same material as the cathode 145 as described above. The metal conductive layer 265 is arranged on the planarization 130 and the wall 150. The blocking layer 260 shown in FIG. 11 is implemented as a double layer structure including the transparent conductive layer 263 and the metal conductive layer 265. The blocking layer 260 may prevent water and oxygen from permeating into the display area 10 since the blocking layer 260 has lower permeability than the planarization layer 130 and the wall 150. Also, the blocking layer 260 may cover a side part of the inorganic insulation layer 75.

Figure 12:
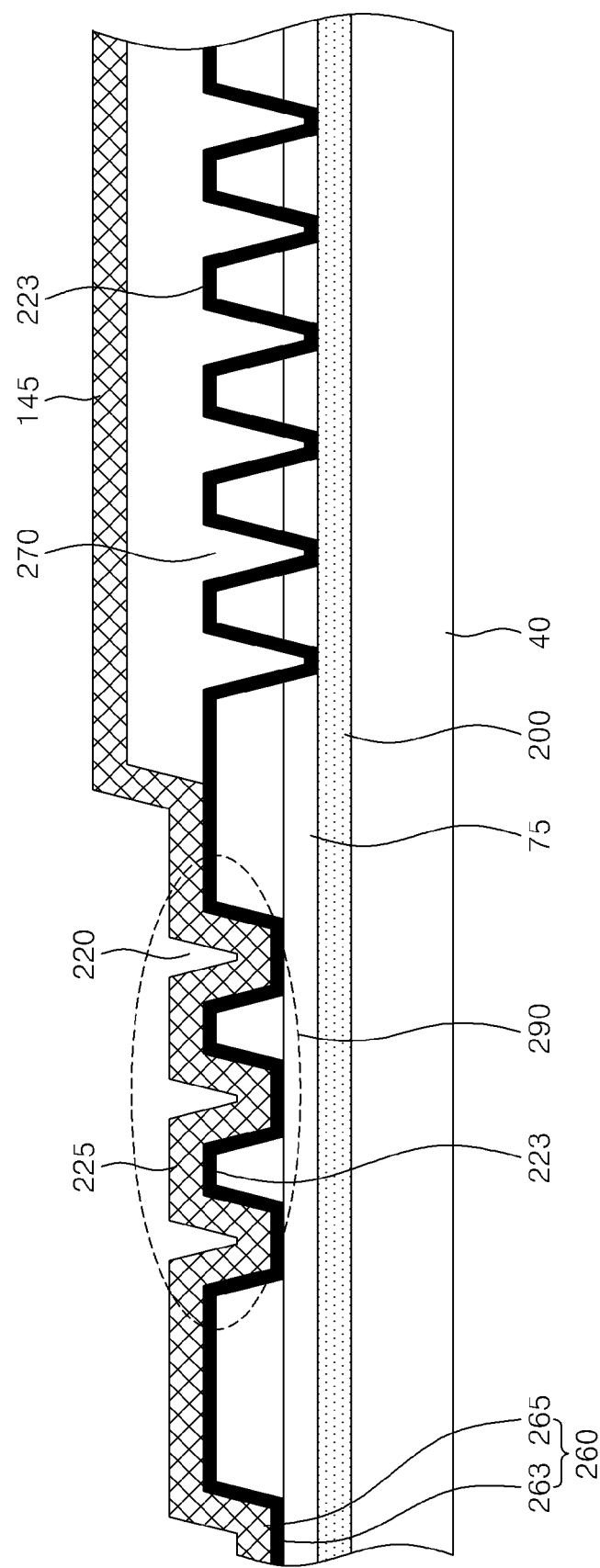
FIG. 12 is a cross-section view showing a non-display area of the organic EL display device according to a seventh exemplary embodiment of the present invention.

FIG. 12 is a cross-section view showing a non-display area of the organic EL display device according to a seventh exemplary embodiment of the present invention.

The non-display area 20 shown in FIG. 12 may include the first, second, and sixth exemplary embodiments of the present invention. Alternately, the non-display area 20 may include the first, second, and fourth or fifth exemplary embodiments of the present invention such that the non-display area 20 includes a permeation prevention barrier 290, a voltage contact portion 270, and a blocking layer 260 consistent with the description provided above.

As described above, the organic EL display device according to the exemplary embodiments of the present invention may include a permeation prevention pattern and a voltage contact portion to prevent water and oxygen from permeating into the display area.

Further, the organic EL display according to the exemplary embodiments of the present invention may include a blocking layer to prevent water and oxygen from permeating into the display area.

Although exemplary embodiments of the present invention have been described in detail hereinabove, it should be clearly understood that many variations and/or modifications of the basic inventive concepts taught herein, which may appear to those skilled in the present art, will still fall within the spirit and scope of the present invention. Thus, it is intended that the present invention cover the modifications and variations of this invention provided they come within the scope of the appended claims and their equivalents.

What is claimed is:

1. An organic electro-luminescent display device, comprising:
   a substrate comprising a display area to display an image and a non-display area arranged on an outer circumference of the display area;
   an organic luminescent element disposed in the display area, the organic luminescent element comprising an anode, an organic light-emitting layer arranged on the anode, and a cathode arranged on the organic light-emitting layer;
   a signal supply line in the non-display area to supply a signal to the organic luminescent element, the signal comprising a gate voltage, a data voltage or a common voltage;
   a passivation layer arranged on the signal supply line; and
   a permeation prevention barrier penetrating the passivation layer, the permeation prevention barrier comprising a barrier layer having a lower permeability than a permeability of the passivation layer.

2. The organic electro-luminescent display device of claim 1, wherein the barrier layer comprises an inorganic material.

3. The organic electro-luminescent display device of claim 1, wherein the barrier layer comprises the same material as the anode or the same material as the cathode.

4. The organic electro-luminescent display device of claim 1, wherein the barrier layer comprises a double layer.

5. The organic electro-luminescent display device of claim 4, wherein the double layer comprises:
   a transparent layer comprising the same material as the anode; and
   a metal layer arranged on the transparent layer and comprising the same material as the cathode.

6. The organic electro-luminescent display device of claim 5, wherein the permeation prevention barrier further comprises a contact portion that penetrates the passivation layer to expose a portion of the signal supply line, and
   the barrier layer is connected to the signal supply line through the contact portion.

7. The organic electro-luminescent display device of claim 6, wherein the permeation prevention barrier is arranged in a permeation prevention pattern.

8. The organic electro-luminescent display device of claim 6, wherein the permeation prevention pattern comprises a line arrangement of permeation prevention barriers.

9. The organic electro-luminescent display device of claim 6, wherein the contact portion comprises a common voltage contact portion, a power voltage contact portion, a data voltage contact portion, or a gate voltage contact portion.

10. The organic electro-luminescent display device of claim 1, wherein the passivation layer comprises an inorganic insulation layer arranged on the signal supply line, and a wall arranged on the inorganic insulation layer.

11. The organic electro-luminescent display device of claim 10, further comprising:
   a planarization layer arranged between the inorganic insulation layer and the wall.

12. The organic electro-luminescent display device of claim 11, further comprising:
   a blocking layer covering at least one of a side part of the wall and a side part of the planarization layer.

13. The organic electro-luminescent display device of claim 12, wherein the blocking layer comprises a transparent conductive layer comprising the same material as the anode or the blocking layer comprises a metal conductive layer comprising the same material as the cathode.

14. The organic electro-luminescent display device of claim 12, wherein the blocking layer comprises:
   a transparent conductive layer comprising the same material as the anode; and
   a metal conductive layer arranged on the transparent conductive layer and comprising the same material as the cathode.

15. The organic electro-luminescent display device of claim 10, further comprising:
   a blocking layer covering a side part of the wall.

16. The organic electro-luminescent display device of claim 15, wherein the blocking layer comprises a transparent conductive layer comprising the same material as the anode or the blocking layer comprises a metal conductive layer comprising the same material as the cathode.

17. The organic electro-luminescent display device of claim 15, wherein the blocking layer comprises:
   a transparent conductive layer comprising the same material as the anode; and
   a metal conductive layer arranged on the transparent conductive layer and comprising the same material as the cathode.

18. An organic electro-luminescent display device, comprising:
   a substrate comprising a display area to display an image and a non-display area arranged on an outer circumference of the display area;
   a gate line and a data line disposed in the display area;
   a switching thin film transistor connected to the gate line and the data line;
   a driving thin film transistor connected to the switching thin film transistor;
   an anode connected to the driving thin film transistor;
   an organic light-emitting layer arranged on the anode;
   a cathode arranged on the organic light-emitting layer;
   a signal supply line disposed in the non-display area to supply a signal to the driving thin film transistor;
   an inorganic insulation layer arranged on the signal supply line;
   a wall arranged on the inorganic insulation layer; and
   a blocking layer covering a side part of the wall, the blocking layer comprising a blocking material having a lower permeability than the wall.

19. The organic electro-luminescent display device of claim 18, further comprising a planarization layer arranged between the inorganic insulation layer and the wall.

20. The organic electro-luminescent display device of claim 19, wherein the blocking layer covers a side part of the planarization layer, the blocking material having a lower permeability than a permeability of the planarization layer.

21. The organic electro-luminescent display device of claim 20, wherein the blocking layer covers a side part of the inorganic insulation layer.

22. The organic electro-luminescent display device of claim 20, wherein the blocking layer comprises the same material as the anode.

23. The organic electro-luminescent display device of claim 18, wherein the blocking layer comprises the same material as the cathode.

24. The organic electro-luminescent display device of claim 18, wherein the blocking layer comprises:
   a transparent conductive layer comprising the same material as the anode, and
   a metal conductive layer arranged on the transparent conductive layer and comprising the same material as the cathode.

25. The organic electro-luminescent display device of claim 18, further comprising a permeation prevention barrier penetrating the inorganic insulation layer and the wall, the permeation prevention barrier comprising a barrier layer having a lower permeability than a permeability of the wall.

* * * * *